United States Patent
Moreland et al.

(10) Patent No.: US 6,191,619 B1
(45) Date of Patent: Feb. 20, 2001

(54) TRANSLATORS AND METHODS FOR CONVERTING DIFFERENTIAL SIGNALS TO SINGLE-ENDED SIGNALS

(75) Inventors: Carl W. Moreland, Oak Ridge; Michael R. Elliott, Greensboro, both of NC (US)

(73) Assignee: Analog Devices, Inc., Norwood, MA (US)

( * ) Notice: Under 35 U.S.C. 154(b), the term of this patent shall be extended for 0 days.

(21) Appl. No.: 09/382,046

(22) Filed: Aug. 24, 1999

(51) Int. Cl.[7] .............................................. H03K 19/086
(52) U.S. Cl. ................... 326/126; 326/89; 326/75
(58) Field of Search .................. 326/75–78, 89, 326/90, 124, 126

(56) References Cited

U.S. PATENT DOCUMENTS

| | | | |
|---|---|---|---|
| 4,794,317 | 12/1988 | van Tran | 323/316 |
| 4,806,799 | 2/1989 | Pelley et al. | 307/475 |
| 4,968,905 | 11/1990 | Sanwo | 307/475 |
| 5,075,580 | 12/1991 | Dayton et al. | 307/475 |
| 5,459,412 | 10/1995 | Mentzer | 326/66 |

*Primary Examiner*—Michael Tokar
*Assistant Examiner*—Don Phu Le
(74) *Attorney, Agent, or Firm*—Koppel & Jacobs

(57) ABSTRACT

High-speed signal translators are provided to convert differential input signals (e.g., ECL signals) to single-ended output signals (e.g., CMOS signals). An exemplary translator is formed with first and second current mirrors, first and second complimentary differential pairs of transistors, a complimentary transistor output stage and first and second current-diverting transistors. The complimentary output stage initially generates the single-ended output signal in response to currents received from the complimentary differential pairs. When the output signal has been established, the current-diverting transistors respond by carrying at least portions of the currents supplied by the complimentary differential pairs. The current-diverting transistors also drive the current mirrors to divert other portions of these currents away from the complimentary output stage. Stored charges in the output stage are accordingly reduced and its response time enhanced. Translator speed is further enhanced with elements associated with the current-diverting transistors that prevent saturation in the current mirrors and the complimentary output stage.

18 Claims, 4 Drawing Sheets

TRANSLATORS AND METHODS FOR CONVERTING DIFFERENTIAL SIGNALS TO SINGLE-ENDED SIGNALS

BACKGROUND OF THE INVENTION

1. Field of the Invention

The present invention relates generally to semiconductor signal translators.

2. Description of the Related Art

A variety of semiconductor families are available for forming modern electronic circuits. Each have advantages and disadvantages and typically require different operating signals. For example, bipolar circuits that are arranged in emitter-coupled structures (termed ECL when used for emitter-coupled logic applications) are fast and generate currents that can drive capacitive loads. This same current generation, however, causes them to consume significant power. In contrast, metal-oxide semiconductor (CMOS) circuits use significantly less power and, although they are generally slower than equivalent bipolar circuits, their low power dissipation makes them particularly suited for realizing densely-packed logic circuits.

When used with a rail-to-rail supply voltage of five volts, for example, guaranteed high and low CMOS logic levels are typically narrow windows (e.g., one-half volt) that adjoin each supply rail. In contrast, the differential pairs of emitter-coupled bipolar structures operate with a much lower swing (e.g., ~200 millivolts) between logic levels. In order to realize the advantages of combined bipolar and CMOS circuits, signal translators are therefore required that can convert relatively-low bipolar signal swings to the nearly rail-to-rail signal swings of CMOS circuits.

Various integrated-circuit fabrication technologies have been developed for these semiconductor families. Although many of these processes are exclusively restricted to bipolar fabrication or to CMOS fabrication, BiCMOS technologies also exist that can place both structures on a single integrated-circuit chip. Regardless of the fabrication technology, combined bipolar and CMOS circuits are typically coupled to the same supply rails which adds a further complication to signal transition between them. Nonetheless, various signal translators have been developed for these families (e.g., see U.S. Pat. Nos. 4,794,317; 4,806,799; 4,968,905; 5,075,580; and 5,459,412).

FIG. 1 illustrates an exemplary signal translator 20 that is restricted to bipolar structures so that it is especially suited for realization with bipolar integrated-circuit fabrication technologies. The signal translator 20 has been incorporated in various products (e.g., AD9042 analog-to-digital converters) of Analog Devices, Inc, the assignee of the present invention.

The translator 20 combines complementary first and second differential pairs 22, active loads in the form of current mirrors 24 and 25 and an output stage 26 that has complementary transistors 28 and 29. In response to typical bipolar signal levels at an input port 32, the complementary differential pairs 22 steers currents $I_1$ to and away from transistors 34 and 35 of the current mirrors. In response to these steered currents, the transistors 28 and 29 communicate output signals via their coupled collectors at a single-ended output port 36.

Because the complementary transistors 28 and 29 are arranged in common-emitter configurations, their coupled collectors can deliver signals that are very near the +V and −V supply rails 38 and 39. In addition, transistors 28 and 29 can generate the currents necessary to drive capacitive loads such as those formed by CMOS circuits and their associated parasitic integrated-circuit capacitances. When driving capacitive loads, an initially high current from transistor 28, for example, will exponentially fall to a small sustaining trickle current as the voltage at the output port 36 approaches the supply rail 38.

The signal at the output port 36 is thus suitable for driving CMOS circuits. Without additional circuitry, however, transistors 28, 29, 34 and 35 will saturate which degrades the speed of the signal translator 20. Accordingly, voltage clamps 42 and 43 are connected to the collectors of transistors 34 and 35. Resistors 44 and 45 respectively couple transistors 48 and 49 of the complementary differential pairs 22 to current-mirror transistors 34 and 35 and diodes 50 and 51 respectively couple the same differential pairs transistors to the output port 36. Finally, current sources 52 and 53 generate currents $I_2$ and are connected between emitters and bases of respective output transistors 28 and 29.

In operation of the translator 20, it is intended that each of the transistors 34 and 35 is on when its associated output transistor is off. The clamps 42 and 43 can be realized in various ways to limit the voltage between the collectors of transistors 34 and 35 and their respective supply rails to a value (e.g., ~300 millivolts) that is sufficient to prevent their saturation while insuring that their associated output transistors 28 and 29 are off.

When a current $I_1$ is steered through transistor 48, it initially flows through resistor 44 and turns on output transistor 28. In response, the single-ended signal at the output port 36 rises to a potential at which it turns on diode 50. Ignoring the small base current of output transistor 28 and the small trickle current flowing to the output port 36 and given that $I_1 > I_2$, it is apparent that the circuit stabilizes with current $I_2$ flowing through resistor 44 and a current $I_1 - I_2$ flowing from output transistor 28 to differential-pair transistor 48 through diode 50.

Because the voltage drop $V_d$ across diode 50 substantially matches the base-emitter drop $V_{be}$ of the output transistor 28, the collector potential of transistor 28 is limited below the supply rail 38 by the product of the current $I_2$ and the resistance of resistor 44. For a given value of the current $I_2$, an appropriate resistance of the resistor 44 can thus be chosen to limit the voltage between the output port 36 and the supply rail 38 to a value (e.g., ~300 millivolts) that is sufficient to prevent saturation of the output transistor 28. The operation described above is repeated in complementary fashion for output transistor 29 when the input signal at the input port 32 causes current to be steered through transistor 49.

It has been observed however, that the speed of the translator 20 is degraded because when each output transistor turns on, it must initially absorb the $I_1$ current of the other in addition to supplying current for driving a capacitive load. When output transistor 28 turns off, for example, stored charges in its base initially continue to support a current of substantially $I_1$. As output transistor 29 turns on, it must absorb this current and therefore the current available to drive a capacitive load is initially reduced by $I_1$ and the time to bring the signal at the output port 36 to a CMOS level is accordingly increased.

SUMMARY OF THE INVENTION

The present invention is directed to high-speed signal translators that convert a differential input signal to a single-ended output signal. This goal is realized with first and second current mirrors, first and second complimentary differential pairs of transistors, a complimentary transistor output stage and first and second current-diverting transistors.

The complimentary output stage initially generates the single-ended output signal in response to currents received from the complimentary differential pairs. When the output signal has been established, the current-diverting transistors respond by carrying portions of the currents supplied by the complimentary differential pairs. The current-diverting transistors drive the current mirrors so that they divert other portions of these currents away from the complimentary output stage.

Stored charges in the output stage are accordingly reduced and its response time enhanced. Translator speed is further enhanced with elements associated with the current-diverting transistors that prevent saturation in the current mirrors and the complimentary output stage.

In a first step of methods of the invention, first and second currents are steered respectively away from a first current path and through a second current path in response to a first polarity of the input signal and steered respectively through the first current path and away from the second current path in response to a second polarity of the input signal.

In response to currents on the first and second current paths, a single-ended output signal is generated with a complimentary transistor output stage. In response to the single-ended output signal, at least a portion of the second current is diverted along a third current path when the input signal has its first polarity and at least a portion of the first current is diverted along a fourth current path when the input signal has its second polarity. The third and fourth current paths are configured to exclude the complimentary output stage.

The translators and methods of the invention are particularly suited for generating single-ended output signals in capacitive loads such as those of CMOS circuits.

These translators and methods generally include the steering of currents in response to first and second polarities of differential input signals (i.e., current-steering input signals). Although balanced signals can effect this steering, the input signals can also be unbalanced signals, i.e., signals having one side tied to a fixed reference.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
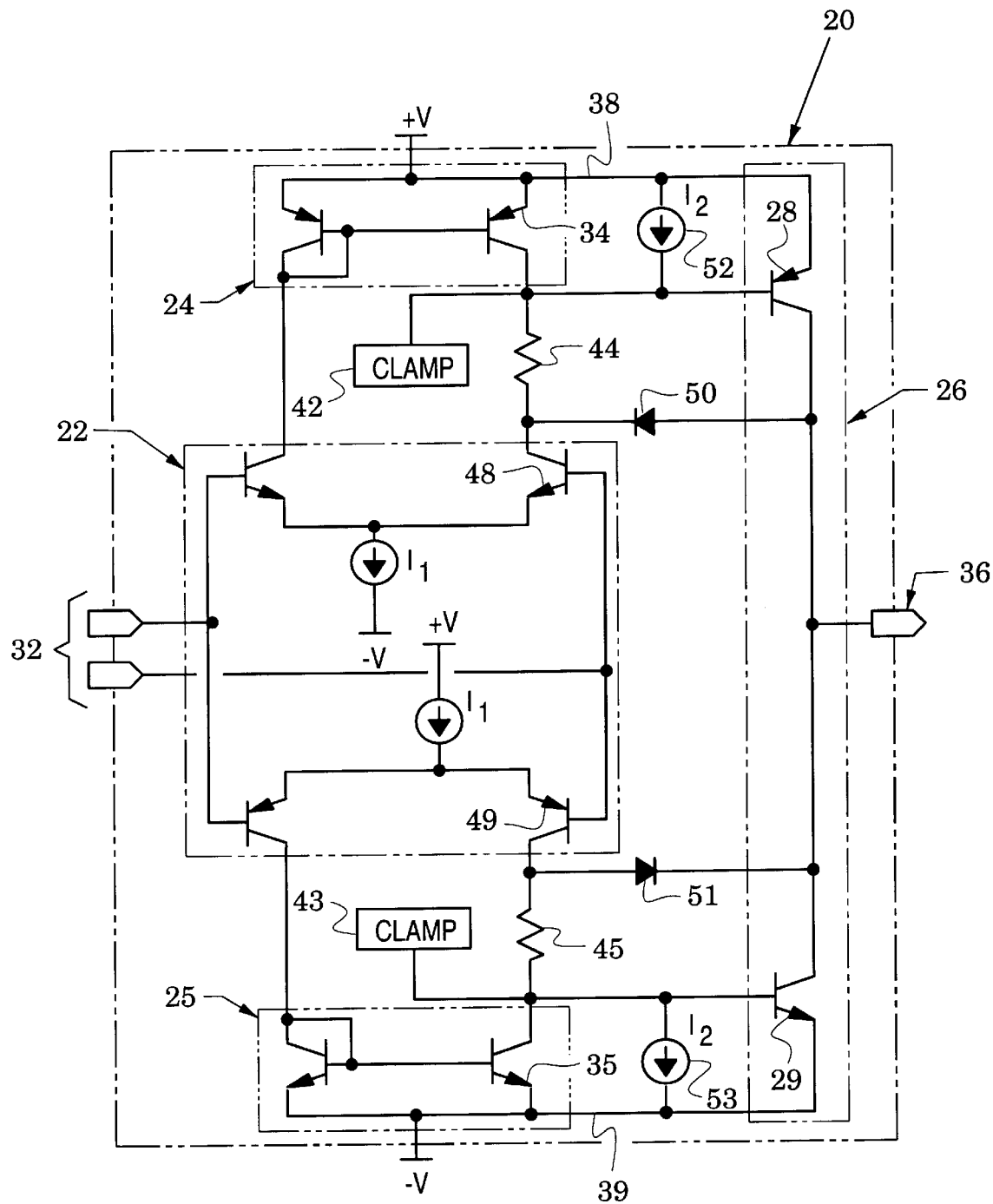
FIG. 1 is a schematic of a prior art signal translator.
Figure 2A:
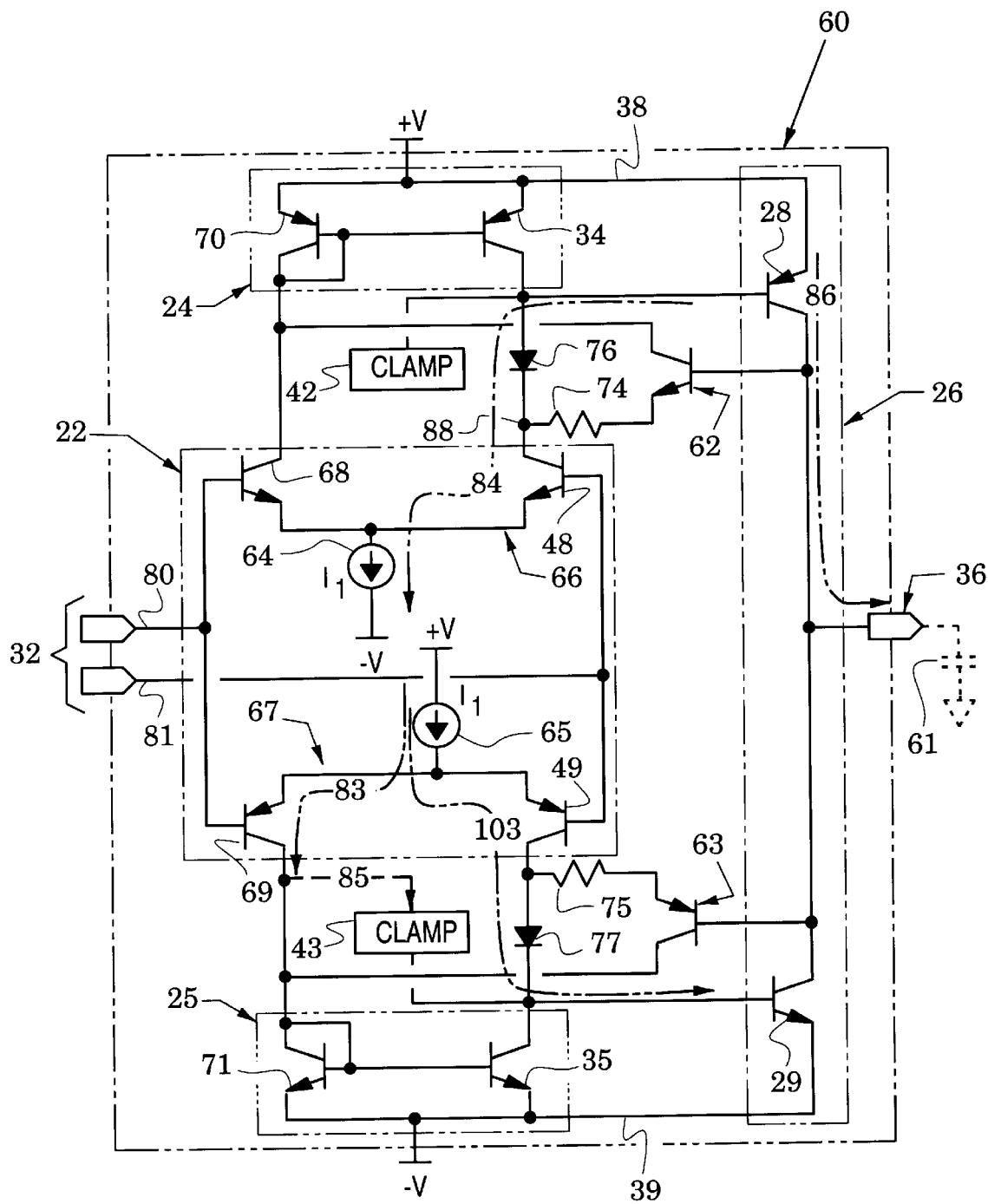
FIGS. 2A and 2B are schematics that illustrate operational phases of a signal translator of the present invention that converts a differential input signal to a single-ended output signal.

FIG. 2A illustrates a signal translator 60 that converts a differential input signal at a differential input port 32 to a single-ended output signal at an output port 36 that is typically coupled to a capacitive load 61 (shown in broken lines). The load 61 may represent the capacitances of CMOS circuits plus associated integrated-circuit parasitic capacitances. The translator 60 includes complimentary differential pairs 22, current mirrors 24 and 25, a complimentary transistor output stage 26 and current-diverting transistors 62 and 63.

In response to signals at the differential input port 32, the differential pairs 22 steer currents $I_1$ from current sources 64 and 65 to thereby complimentarily turn on output transistors 28 and 29 and generate the single-ended output signal. In response to the output signal, the current-diverting transistors 62 and 63 divert substantially all of the currents $I_1$ away from the output transistors 28 and 29 after they have appropriately charged the capacitive load 61. Accordingly, the turn-on speed of each output transistor is enhanced because it does not have to discharge large amounts of stored charge in the base of the other output transistor.

Directing attention now to translator details, the complimentary differential pairs 22 includes differential pairs 66 and 67 that respectively have transistors 68 and 48 and transistors 69 and 49. The emitters of the differential pairs 66 and 67 are respectively joined to the current sources 64 and 65 that each provide a current $I_1$. The bases of the differential pairs are complimentarily connected to the differential input port 32.

The current mirror 24 has a diode-connected transistor 70 that is coupled to mirror its current to the transistor 34 and is further coupled to transistor 68 of the differential pair 66. Similarly, the current mirror 25 has a diode-connected transistor 71 that is that is coupled to mirror its current to the transistor 35 and is further coupled to transistor 69 of the differential pair 67.

The complimentary output stage 26 has its complementary transistors 28 and 29 arranged in common-emitter configurations with collectors joined to the single-ended output port 36 and bases respectively connected to collectors of the current-mirror transistors 34 and 35.

The current-diverting transistor 62 has its base responsive to the output port 36, its collector coupled to the output of the diode-connected transistor 70 and its emitter coupled through a resistor 74 to the differential-pair transistor 48. A diode 76 connects the output of the current-mirror transistor 34 to the differential-pair transistor 48.

Similarly, the current-diverting transistor 63 has its base responsive to the output port 36, its collector coupled to the output of the diode-connected transistor 71 and its emitter coupled through a resistor 75 to the differential-pair transistor 49. A diode 77 connects the output of the current-mirror transistor 35 to the differential-pair transistor 49.

In the following operational description of the signal translator 60, it is assumed that the output port 36 is coupled to the capacitive load 61. In operation, a first polarity of the input signal (that occurs when terminal 80 is more positive than terminal 81) at the input port 32 steers currents $I_1$ of current sources 64 and 65 respectively to the diode-coupled transistor 70 and the transistor 35 of current mirrors 24 and 25. A different second polarity of the input signal steers the currents $I_1$ of current sources 64 and 65 respectively to the transistor 34 and the diode-coupled transistor 71.

To further describe the translator's operation, it is now assumed that the input signal is in its second polarity. During this polarity, a current $I_1$ will flow along a current path 83 and another current $I_1$ will initially flow along a current path 84.

Current on the current path 83 flows through the diode-coupled transistor 71 and, in response, an equal current is mirrored through transistor 35. The clamp 43 is designed to limit the voltage differential between the collector of transistor 35 and its respective supply rail 39 to a value (e.g., ~300 millivolts) that is sufficient to prevent saturation of transistor 35 while insuring that the associated output transistor 29 is off. The clamp 43 is also preferably designed to present a low impedance path 85 (indicated in broken lines) to the collector of transistor 69. Accordingly, the current path 83 will be terminated with equal currents of magnitude $I_1/2$ that flow through the transistors 71 and 35 of the current mirror 25.

Current on current path 84 initially pulls base current from output transistor 28 through diode 76. Accordingly, output transistor 28 turns on and drives current along current path 86 to charge the capacitive load 61. At this time, the potential of circuit node 88 is approximately two diode drops (supplied by the base-emitter junction of transistor 28 and by the diode 76) below the supply rail 38. As the capacitive load 61 is charged, the voltage at the base of current-diverting transistor 62 rises and begins to turn on this transistor when it reaches approximately one diode drop below the supply rail 38.

Figure 2B:
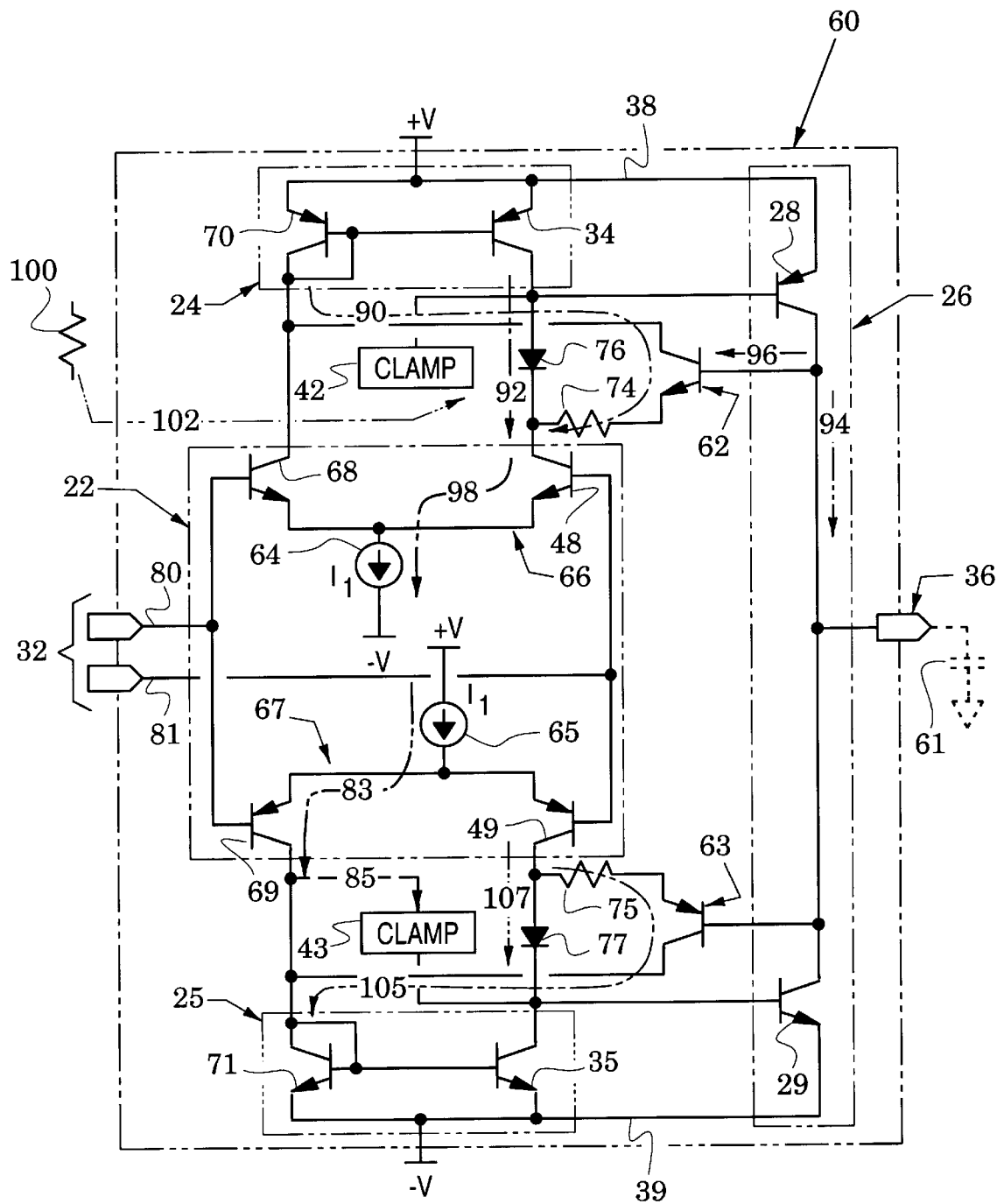

Attention is now directed to FIG. 2B which is similar to FIG. 2A with like elements indicated by like reference numbers. This figure illustrates additional operational phases of the translator 60. In particular, the current-diverting transistor 62 now responds to the rising voltage on its base by pulling current along current path 90 from the diode-coupled transistor 70 of the current mirror 24.

In response, an equal current is mirrored along current path 92 through transistor 34 and diode 76. At the end of this process, the output transistor 28 only supplies a trickle current 94 to maintain the charge across the capacitive load 61 and supplies a small base current 96 to the current-diverting transistor 62. Ignoring these small currents, a current $I_1$ along current path 98 is now supplied by equal currents of magnitude $I_1/2$ along current paths 90 and 92.

The base current 96 is thus $(I_1/2)/\beta = I_1/2\beta$ in which $\beta$ is the current gain of the current-diverting transistor 62. If it is assumed that the current gain $\beta=100$, the base current 96 is only $I_1/200$. Because it only supplies this small current and the trickle current 94, very little charge the charge stored in the base of the output transistor 28 is reduced to a small value.

It is now assumed that the input signal changes from its second polarity to its first polarity which steers the current of the current source 64 away from the output transistor 28 and steers the current of the current source 65 through transistor 49 and into the base of the output transistor 29. In response, nearly all of the current capability of the output transistor is applied to pull current from the capacitive load 61. The only current diverted from this task is that required to remove the small base charge from output transistor 28 which has just turned off.

Because this transistor was previously supporting the small base current $I_1/2\beta$ and the trickle current 94, it has very little base charge that needs to be removed and the signal translator 60 quickly changes the signal state across the capacitive load 61. In the absence of the present invention, the output transistor 28 would have been conducting a current $I_1$ and accordingly, it would have had a substantially greater stored base charge which would have significantly slowed the transition to a new signal state across the capacitive load.

The resistor 74 and the diode 76 (and corresponding resistor 75 and diode 77) are included in the translator 60 to prevent saturation of the output transistor 28 and thus further enhance the speed of the translator.

This is accomplished by limiting the voltage differential between the output port 36 and the supply rail 38 to a value (e.g., ~300 millivolts) that is sufficient to prevent saturation.

When output transistor 28 is on, it was previously noted that the potential of the circuit node 88 is approximately two diode drops below the supply rail 38. The current-diverting transistor 62 inserts a diode drop (via its base-emitter junction) between the circuit node 88 and the collector of the output transistor 28. Thus, the output transistor can be held out of saturation by choosing resistor 74 so that a product of its resistance and the current $I_1/2$ is appropriately less than a diode drop. If this product is 400 millivolts, for example, the voltage across the output transistor 28 will be limited to 300 millivolts.

Although the resistor 74 and the diode 76 enhance operation of the translator 60, other translator embodiments can be formed with other arrangements. In one embodiment, the diode 76 can be replaced by a resistor 100 as indicated by replacement arrow 102. This resistor and the resistor 74 both carry currents of approximately $I_1/2$, and their resistances can be chosen to hold output transistor 28 out of saturation. In another embodiment of the translator 60, the resistor 74 can be removed and the diode 76 replaced by a resistor that is chosen so that a product of its resistance and the current $I_1/2$ is sufficient (e.g., ~300 millivolts) to hold the output transistor 28 out of saturation.

The invention provides methods for converting a differential input signal to a single-ended output signal (e.g., an ECL signal to a CMOS signal). In a first step of these methods, first and second currents are steered respectively away from a first current path and through a second current path in response to a first polarity of the input signal and steered respectively through the first current path and away from the second current path in response to a second polarity of the input signal. In FIG. 2A, the first and second currents are generated by current sources 64 and 65 and the first and second current paths are the current paths 84 and 103.

In response to currents on the first and second current paths, a single-ended output signal is generated with a complimentary transistor output stage. Preferably, this is a complementary stage formed with common-emitter transistor configurations, i.e., the stage 26 of FIG. 2A.

In response to the single-ended output signal, a portion of the second current is diverted along a third current path when the input signal has its first polarity and a portion of the first current is diverted along a fourth current path when the input signal has its second polarity. The third and fourth current paths are configured to exclude the complimentary transistor output stage. In FIG. 2B, the third and fourth current paths are the current paths 90 and 105 that respectively include the current terminals of current-diverting transistors 62 and 63.

In addition, the current-diverting transistors drive current mirrors to divert other portions of the first and second currents away from the complimentary output stage. These portions travel along current paths 92 and 107 in FIG. 2B. Stored charges in the complimentary output stage are accordingly reduced and its response time enhanced.

Figure 3:
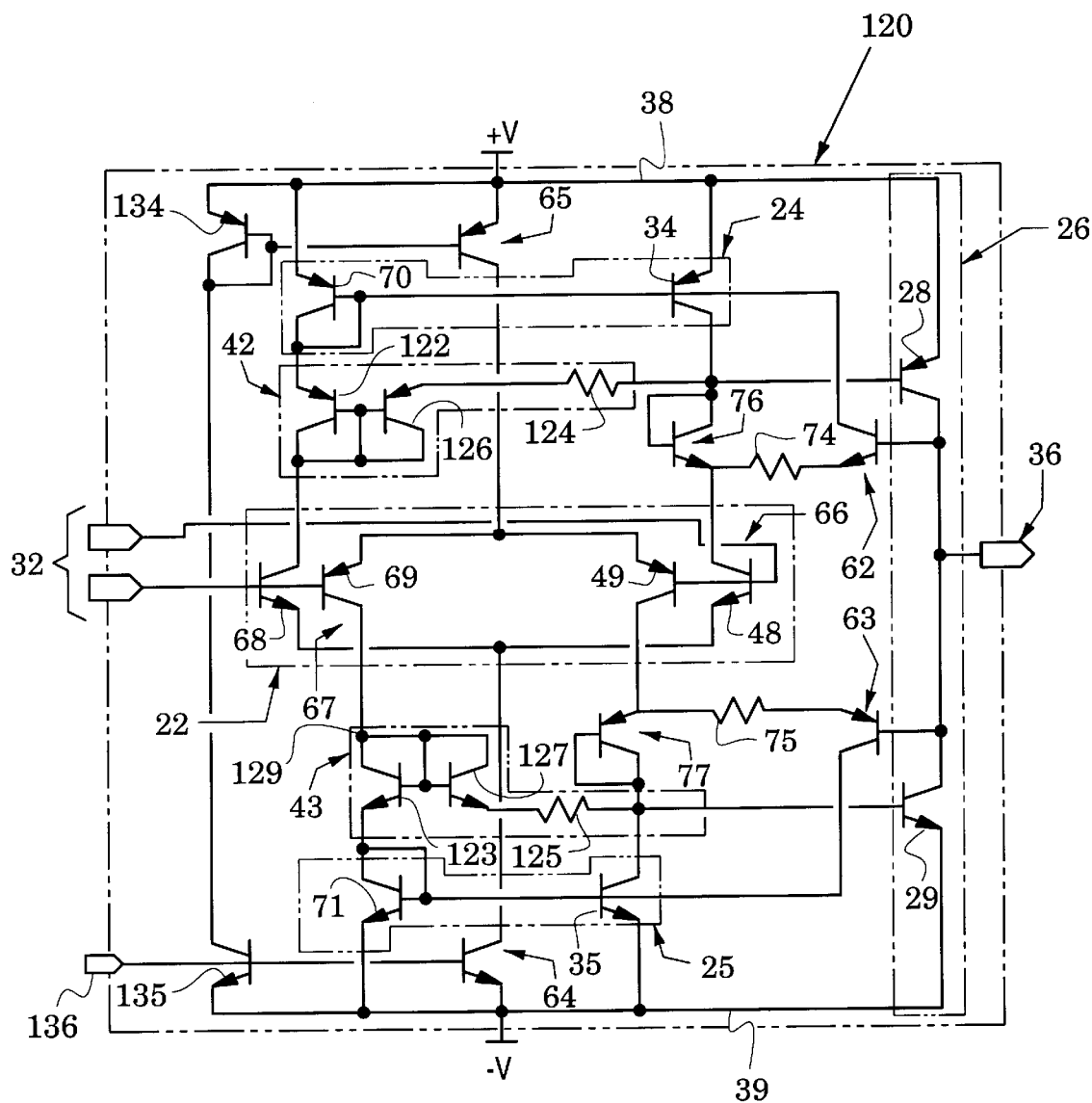
FIG. 3 is a schematic of another signal translator of the present invention.

FIG. 3 illustrates a translator 120 that is similar to the translator 60 of FIGS. 2A and 2B with like elements indicated by like reference numbers. The translator 120 includes embodiments of the clamps 42 and 43 and is especially configured for integrated-circuit fabrication.

As previously noted, the clamp 43 is designed to limit the voltage differential between the collector of transistor 35 and its respective supply rail 39 to a value that is sufficient to prevent saturation of transistor 35 while insuring that the associated output transistor 29 is off. These conditions exist when current is steered along the current path 83 of FIG. 2A. The clamp 43 is also preferably designed to present a low impedance path (85 in FIG. 2A) to the collector of transistor 69.

Accordingly, the clamp 43 of FIG. 3 includes a diode-coupled transistor 123 inserted between transistor 69 and the diode-coupled transistor 71 and a series combination of a resistor 125 and a diode-coupled transistor 127 inserted between the collectors of transistors 69 and 35. The clamp 42 is configured similarly with a diode-coupled transistor 122 and a series combination of a resistor 124 and a diode-coupled transistor 126.

In operation of the clamp 43, it is noted that when current is steered through transistor 69 of the differential pair 67, the potential of current node 129 is two diode drops above the supply rail 39 (due to the diode-coupled transistors 123 and 71). From this current node, the diode-coupled transistor 127 and the resistor 125 insert voltage drops between the circuit node 129 and the collector of transistor 35.

The voltage drop of diode-coupled transistor 127 cancels one of the two diode drops. Accordingly, the collector of transistor 35 will be held at a voltage differential equal to the difference of the other diode drop and the voltage drop across the resistor 125. The resistance of the resistor 125 can then be calculated with knowledge that, as described above, it carries a current substantially equal to $I_1/2$.

In the translator 120, the currents of the current sources 64 and 65 are forced to be equal by a current translator that is formed by serially coupling a diode-coupled transistor 134 and a transistor 135 between the supply rails 38 and 39. The diode-coupled transistor 134 is coupled to the current source 65 and control terminals of the transistor 135 and the current source 64 are coupled together. The currents of the current sources 64 and 65 are selected with a potential at a potential port 136 that is connected to the bases of transistor 135 and current source 64.

The differential pairs of the invention's translators (e.g., complementary differential pairs 22 of FIG. 2A) steer currents in response to differential input signals (i.e., they respond to current-steering input signals). Although balanced signals can effect this steering, the input signals can also be unbalanced signals, i.e., one side of the differential signals can be a fixed reference signal (e.g., a circuit ground).

Although the invention has been described with reference to bipolar transistors, the teachings of the invention may be practiced with any transistors that have first and second current terminals (e.g., emitters and collectors) that are responsive to control terminals (e.g., bases).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A signal translator that converts a current-steering input signal to a single-ended output signal, comprising:
    a first current mirror that has first and second current ports;
    a second current mirror that has third and fourth current ports;
    first and second complimentary differential pairs of transistors coupled to respectively steer first and second currents to said first and fourth current ports in response to a first polarity of said input signal and to respectively steer said first and second currents to said second and third current ports in response to a second polarity of said input signal;
    a complimentary transistor output stage that generates said single-ended output signal in response to received currents from said second and fourth current ports; and
    first and second current-diverting transistors arranged to respond to said single-ended output signal by respectively carrying at least a portion of said second current when said input signal has said first polarity and by respectively carrying at least a portion of said first current when said input signal has said second polarity;
    current diversion of said current-diverting transistors thereby enhancing the speed of said translator.

2. The signal translator of claim 1, wherein said first current-diverting transistor is coupled between said first current port and said first differential pair and has a control terminal coupled to receive said output signal and wherein said second current-diverting transistor is coupled between said fourth current port and said second differential pair and has a control terminal coupled to receive said output signal.

3. The signal translator of claim 1, further including:
    first and second resistors inserted to respectively carry current between said first current-diverting transistor and said first differential pair and carry current between said second current-diverting transistor and said second differential pair; and
    first and second diodes inserted to respectively carry at least a portion of said first current between said second current port and said first differential pair in response to said second polarity and carry at least a portion of said second current between said fourth current port and said second differential pair in response to said first polarity.

4. The signal translator of claim 3, wherein said first and second current-diverting transistors are bipolar transistors and said first and second current mirrors, said first and second diodes and said complimentary transistor output stage comprise bipolar transistors.

5. The signal translator of claim 1, further including:
    first and second resistors inserted to respectively carry current between said first current-diverting transistor and said first differential pair and carry current between said second current-diverting transistor and said second differential pair; and
    third and fourth resistors inserted to respectively carry at least a portion of said first current between said second current port and said first differential pair in response to said second polarity and carry at least a portion of said second current between said fourth current port and said second differential pair in response to said first polarity.

6. The signal translator of claim 1, further including first and second resistors inserted to respectively carry current between said first current-diverting transistor and said first differential pair and carry current between said second current-diverting transistor and said second differential pair.

7. The signal translator of claim 1, wherein said first and second current mirrors respectively include first and second current-mirror transistors that are respectively coupled to said second and fourth current ports and further including first and second clamps respectively coupled to said second and fourth current ports and configured to prevent saturation of said first and second current-mirror transistors.

8. The signal translator of claim 7, wherein said first and second clamps respectively provide low-impedance paths to said first and third current ports.

9. The signal translator of claim 1, further including first and second current sources that provide said first and second currents.

10. A signal translator that converts a current-steering input signal to a single-ended output signal, comprising:

a first current mirror having first and second current ports;

a second current mirror having third and fourth current ports;

a complimentary transistor output stage having first and second control terminals that are respectively coupled to said second and fourth current ports and having an output terminal that provides said single-ended output signal;

first and second current-diverting transistors having control terminals that are coupled to said output terminal and further having first and second current terminals with said second current terminals respectively coupled to said first and third current ports;

a first resistor having first and second ends with said second end coupled to the first current terminal of said first current-diverting transistor;

a second resistor having third and fourth ends with said fourth end coupled to the first current terminal of said second current-diverting transistor;

first and second diodes respectively coupled between said second current port and said first resistor end and between said fourth current port and said third resistor end; and first and second complimentary differential pairs of transistors coupled to steer first and second currents respectively to said first current port and to said third resistor end in response to one polarity of said input signal and to steer said first and second currents respectively to said first resistor end and to said third current port in response to another polarity of said input signal;

said first and second resistors and said first and second diodes preventing saturation in said complimentary transistor output stage and current diversion of said current-diverting transistors further enhancing the speed of said translator.

11. The signal translator of claim 10, wherein said first and second current mirrors include first and second current-mirror transistors respectively coupled to said second and fourth current ports and further including first and second clamps respectively coupled to said second and fourth current ports and configured to prevent saturation of said first and second current-mirror transistors.

12. The signal translator of claim 10, wherein said complimentary transistor output stage is a complimentary common-emitter stage, said first and second control terminals are first and second bases and said output terminal is formed with coupled collectors.

13. The signal translator of claim 10, wherein said first and second current-diverting transistors are bipolar transistors and said first and second current mirrors, said first and second diodes and said complimentary transistor output stage comprise bipolar transistors.

14. The signal translator of claim 10, further including first and second current sources that provide said first and second currents.

15. A method of converting a current-steering input signal to a single-ended output signal, comprising the steps of:

steering first and second currents respectively away from a first current path and through a second current path in response to a first polarity of said input signal and respectively through said first current path and away from said second current path in response to a second polarity of said input signal;

in response to currents on said first and second current paths, generating said single-ended output signal with a complimentary transistor output stage; and in response to said single-ended output signal, diverting at least a portion of said second current along a third current path when said input signal has said first polarity and diverting at least a portion of said first current along a fourth current path when said input signal has said second polarity wherein said third and fourth current paths exclude said complimentary transistor output stage.

16. The method of claim 15, wherein said generating step includes the step of forming said complimentary transistor output stage with first and second common-emitter configurations.

17. The method of claim 15, wherein said diverting step includes the steps of:

forming portions of said third and fourth current paths respectively with the current terminals of first and second current-diverting transistors; and arranging control terminals of said first and second current-diverting transistors to be responsive to said single-ended output signal.

18. The method of claim 15, wherein said diverting step includes the step of driving first and second current mirrors to divert additional portions of said first and second currents away from said complimentary transistor output stage.

* * * * *